United States Patent [19]
Hoshi et al.

[11] Patent Number: 5,311,469
[45] Date of Patent: May 10, 1994

[54] SEMICONDUCTOR MEMORY DEVICE

[75] Inventors: Satoru Hoshi, Kawasaki; Masami Masuda, Yokohama; Kazuhiko Takahashi, Tokyo, all of Japan

[73] Assignee: Kabushiki Kaisha Toshiba, Kawasaki, Japan

[21] Appl. No.: 845,654

[22] Filed: Mar. 4, 1992

[30] Foreign Application Priority Data

Mar. 4, 1991 [JP] Japan .................................. 3-37577

[51] Int. Cl.[5] .............................................. G11C 7/00
[52] U.S. Cl. ............................... 365/189.05; 365/205; 365/207; 365/208
[58] Field of Search .................... 365/189.05, 205, 207, 365/208

[56] References Cited

U.S. PATENT DOCUMENTS

| | | | |
|---|---|---|---|
| 4,891,792 | 1/1990 | Hanamura et al. | 365/189.05 |
| 5,023,841 | 6/1991 | Akrout et al. | 365/189.05 |
| 5,068,831 | 11/1991 | Hoshi et al. | 365/189.05 |

Primary Examiner—Eugene R. LaRoche
Assistant Examiner—Frank Niranjan
Attorney, Agent, or Firm—Foley & Lardner

[57] ABSTRACT

A semiconductor memory device including: a memory cell array having at least one cell array unit, the cell array unit including a plurality of memory cells; a decoder for selecting at least one the memory cell in accordance with an externally supplied address; an input/output terminal for outputting data read from the selected memory cell and for receiving data supplied externally and sending the data to the selected memory cell; at least one data line for connecting the input/output terminal to each the cell array unit; sense amplifiers serially connected to each the data line in a multiple stage configuration for amplifying the read data; a write buffer connected in parallel with one of the sense amplifiers connected to each data line; by-pass switching elements connected between input and output terminals of the other sense amplifiers connected to each the data line; and a control circuit for applying an on-signal to at least one by-pass switching element when writing data, the on-signal turning on at least one by-pass switching element.

13 Claims, 6 Drawing Sheets

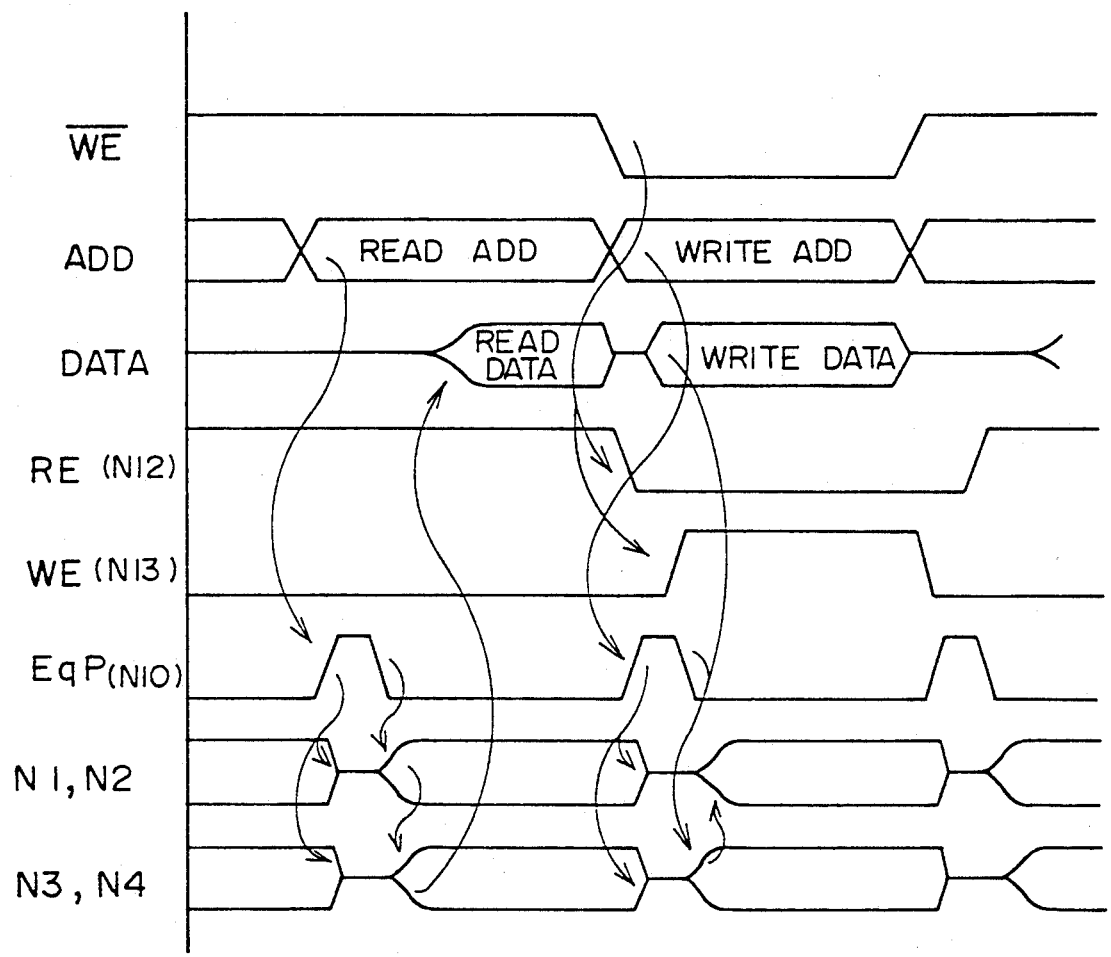
FIG. ID

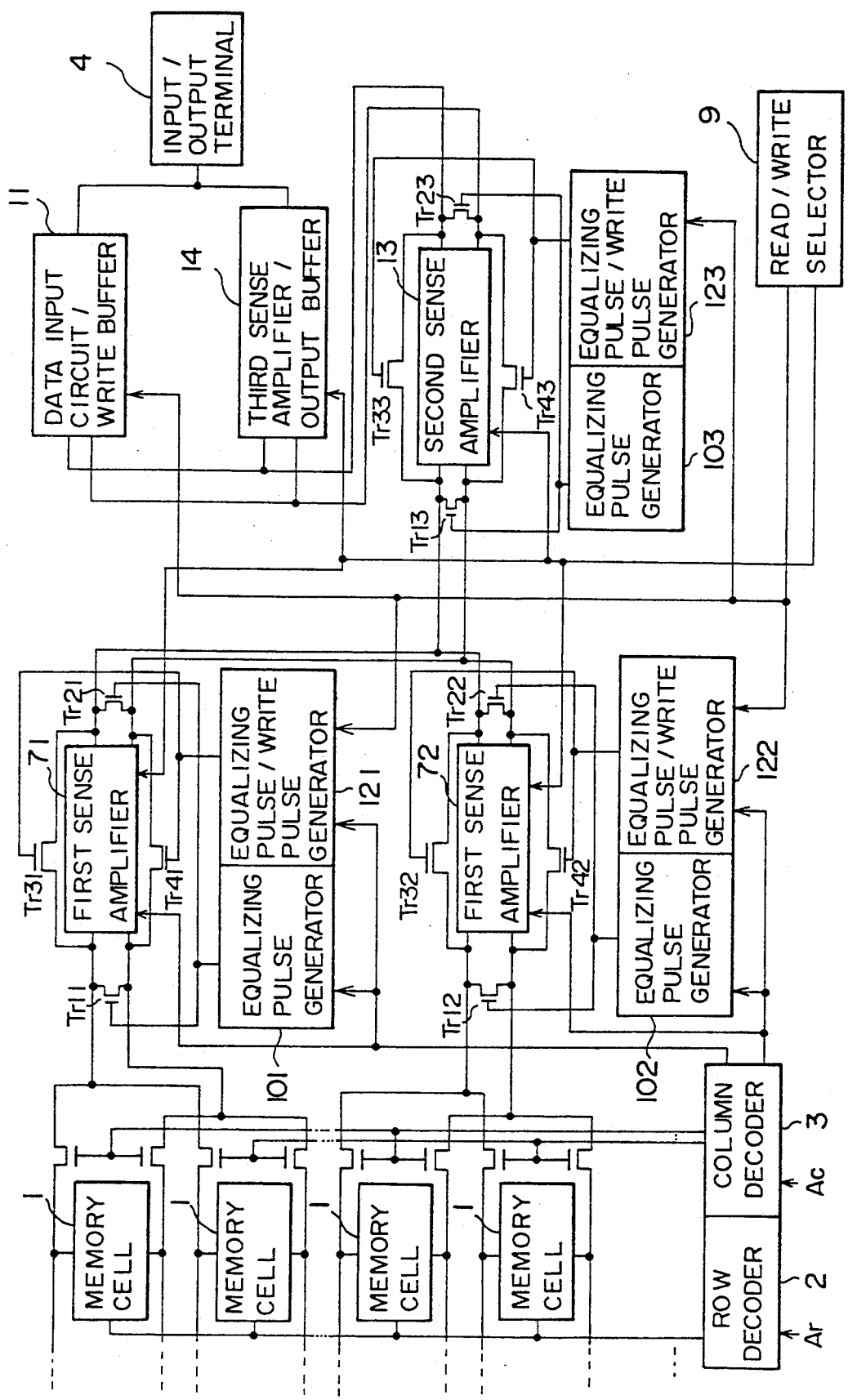
F I G. 3

SEMICONDUCTOR MEMORY DEVICE

FIELD OF THE INVENTION

The present invention relates to a semiconductor memory device, and more particularly to a semiconductor memory device suitable for application to memory devices having a plurality of stages of sense amplifiers connected to data lines.

BACKGROUND OF THE INVENTION

FIG. 1 shows a conventional semiconductor integrated circuit, particularly the details of a data read/write circuit portion for memory cells. As shown in FIG. 1, memory cells 1 are disposed in a matrix configuration. Any one of memory cells 1 can be selected by a row decoder 2 and a column decoder 3. A first sense amplifier 7 and a second sense amplifier/output buffer 8 are used when reading data from a memory cell 1. These circuits 7 and 8 read the data and send it to an input/output terminal 4. A data input circuit/first write buffer 5 and a second write buffer 6 are used when writing data to a memory cell 1. These circuits 5 and 6 write data from the input/output terminal 4 to a memory cell 1. Data read/write is selected by a read/write selector 9. First to fourth MOS transistors Tr1 to Tr4 turn on upon reception of an equalizing pulse outputted from an equalizing pulse generator 10 when an address for selecting a memory cell 1 changes. When the MOS transistors Tr1 to Tr4 are turned on, data accessed during a previous cycle is invalidated. The MOS transistors Tr1 and Tr2 equalize complementary data lines.

FIGS. 1A and 1B show the details of the circuits 9 and 10, respectively. Signals applied to the circuit 10 are generated in a circuit shown in FIG. 1C. In FIG. 1C, circuits labeled as the same reference numeral "15" show the same circuits.

With the circuit arrangement constructed as above, in reading data, the read/write selector 9 makes active the first sense amplifier 7 and second sense amplifier/output buffer 8, and makes inactive the data input circuit/first write buffer 5 and second write buffer 6. In this condition, the state (data) of a memory cell selected by the row decoder 2 and column decoder 3 is transferred to the first sense amplifier 7. This state is sent to the input/output terminal 4 via the second sense amplifier/output buffer 8. On the other hand, in writing data, the read/write selector 9 makes inactive the first sense amplifier 7 and second sense amplifier/output buffer 8, and makes active the data input circuit/first write buffer 5 and second write buffer 6. In this condition, data inputted from the input/output terminal 4 is written in a memory cell 1 selected by the row decoder 2 and column decoder 3. An equalizing pulse from the equalizing pulse generator 10 is supplied to the first to fourth MOS transistors Tr1 to Tr4 when an address is changed. Therefore, data in a memory cell 1 accessed at the preceding cycle is invalidated, to thus improve access speed.

The operation of the circuit shown in FIG. 1 is illustrated in a timing chart FIG. 1D in detail.

A serial connection of multiple stages including the first sense amplifier 7 and second sense amplifier/output buffer 8 is used in reading data. With this arrangement, the length of data line is divided and shortened, so that load capacitance to be driven by a memory cell 1 can be reduced and the data can be efficiently amplified. Similarly, a serial connection of multiple stages including the data input circuit/first write buffer 5 and second write buffer 6 is used in writing data. This arrangement results from substantially the same reason described above.

Conventionally, a multiple stage configuration has been applied to both reading and writing data via common data lines. A write buffer is therefore required to be provided for each data read stage. This results in an increased area of circuit pattern and an increased power consumption by a plurality stage of write buffers.

SUMMARY OF THE INVENTION

The present invention has been made in consideration of the above circumstances. It is an object of the present invention to eliminate the need for a multiple stage configuration of write buffers even if a memory device has a data line structure with a plurality of stages of amplifiers, while reducing the integrated circuit area and power consumption.

A desired memory cell in a memory cell array is selected by decoders. In a read operation, data in the selected memory cell is amplified by a plurality of stages of amplifiers and sent to an input/output terminal. In a write operation, an output from a conduction control signal output circuit makes conductive by-pass switching elements. As a result, write data applied to the input/output terminal by-passes the switching elements and directly written in the selected memory cell.

As described above, according to the present invention, even if a plurality of stages of sense amplifiers for reading data from a memory cell are used, it is not necessary to provide a corresponding plurality of stages of write buffers, simply by turning on equalizing transistors when writing data. Therefore, the structure of an integrated circuit can be simplified and the circuit area and power consumption can be reduced.

BRIEF DESCRIPTION OF THE DRAWINGS

FIG. 1D is a timing chart which shows an operation of the circuit shown in FIG. 1.

FIG. 3 is a circuit diagram showing another embodiment of the present invention.

DESCRIPTION OF THE PREFERRED EMBODIMENTS

Preferred embodiments of the present invention will be described with reference to the accompanying drawings.

Figure 1:
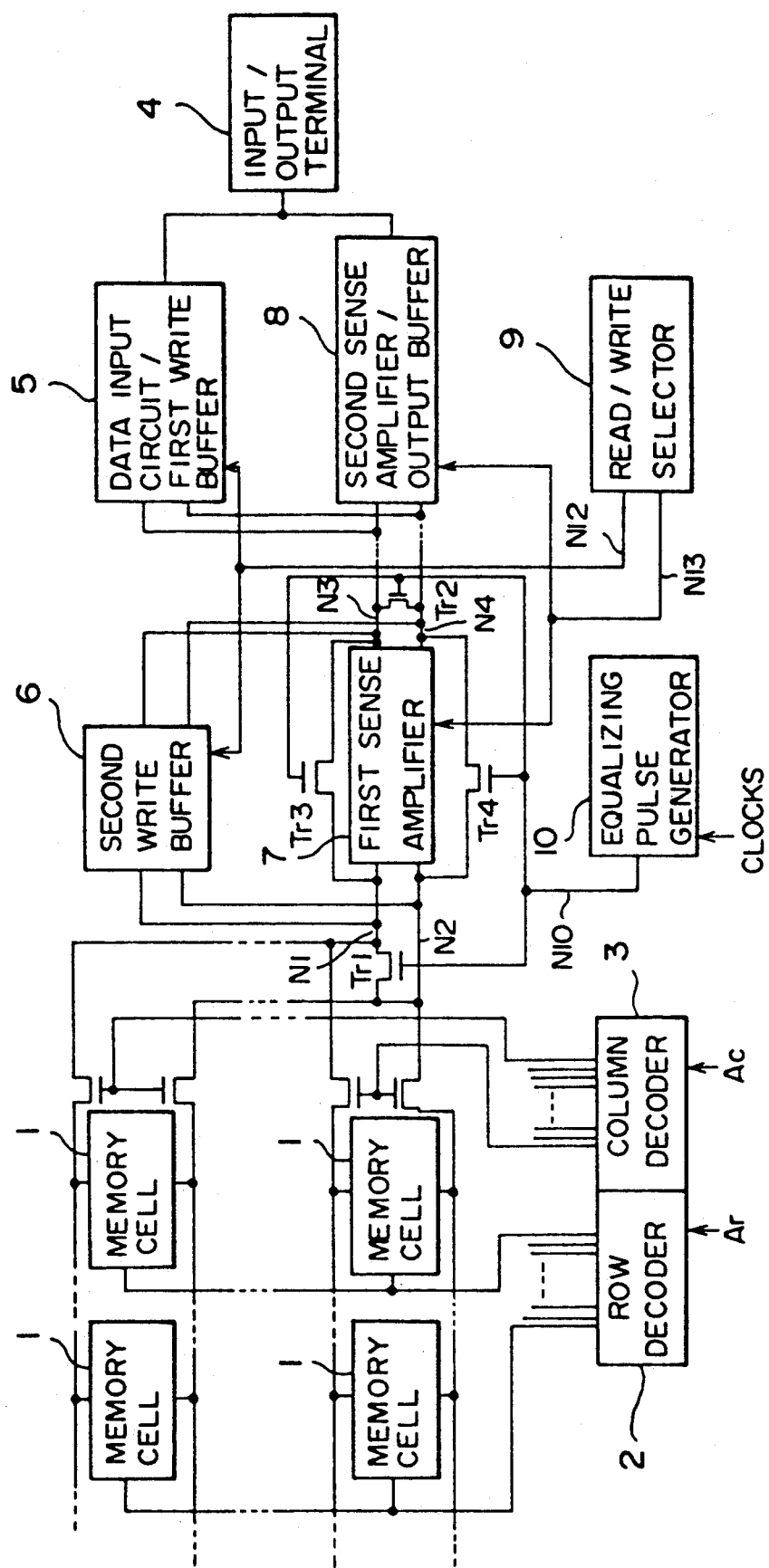
FIG. 1 is a circuit diagram showing the structure of a conventional semiconductor integrated circuit.
Figure 2:
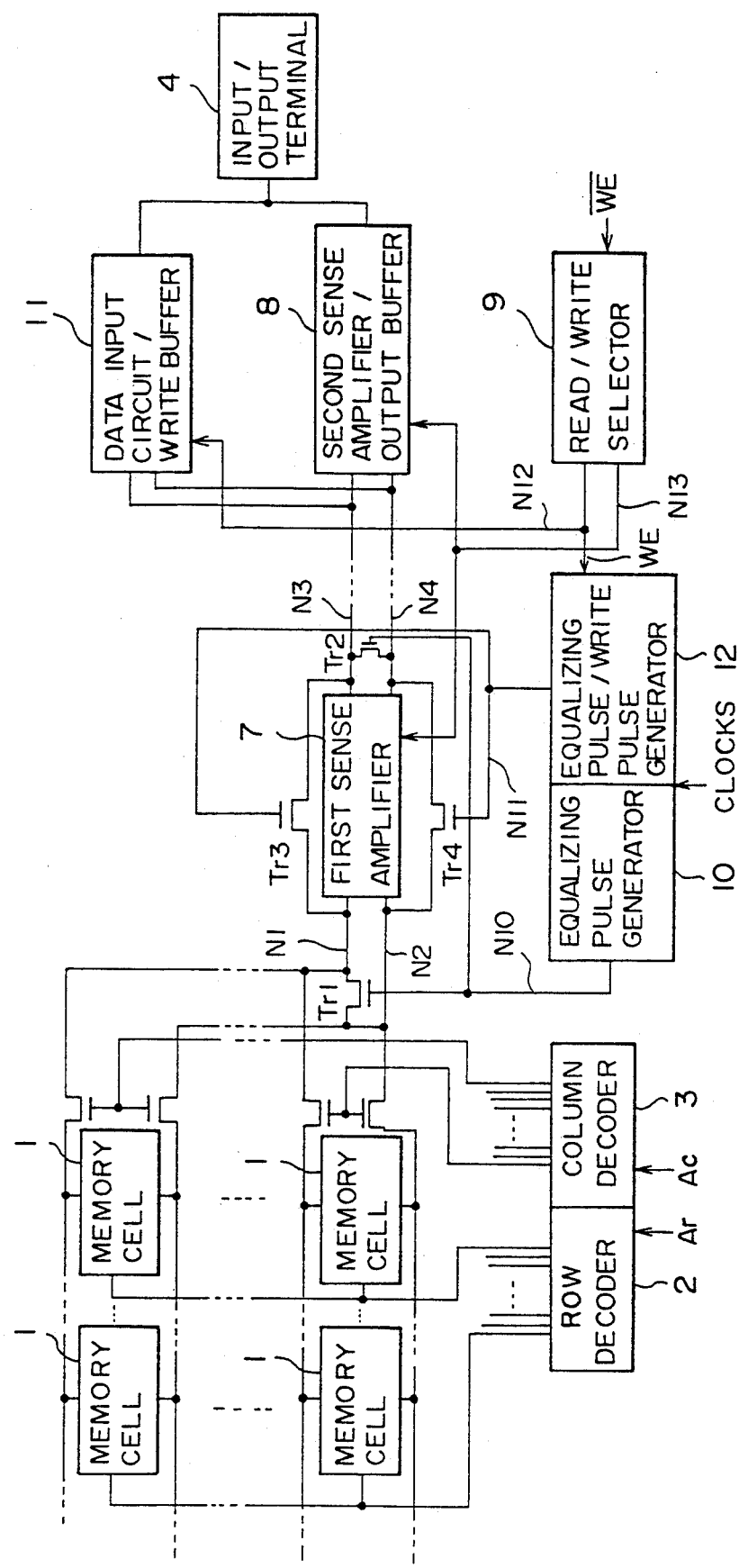
FIG. 2 is a circuit diagram showing an embodiment of the present invention.

FIG. 2 is a circuit diagram showing a semiconductor integrated circuit according to an embodiment of the present invention. As shown in FIG. 2, first and second MOS transistors Tr1 and Tr2 provided for a first sense amplifier 7 are inputted with an equalizing pulse from an equalizing pulse generator 10, similar to the conventional circuit shown in FIG. 1. Third and fourth MOS transistors Tr3 and Tr4 are inputted with a write pulse at a different timing from an equalizing pulse/write pulse generator 12. This generator 12 is supplied with a signal representative of a data write timing, from a read/write selector 9. Data at an input/output terminal 4 is written in a memory cell 1 via a single stage of a data input/output circuit/write buffer 11.

Figure 1A:
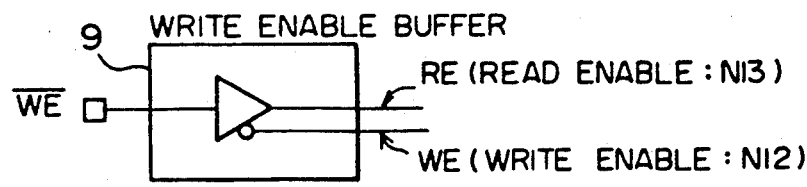
FIGS. 1A and 1B show details of circuits 9 and 10 shown in FIG. 1.
Figure 1B:
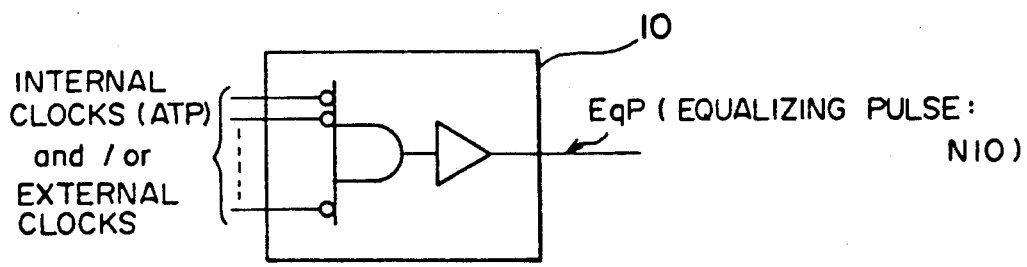
Figure 1C:
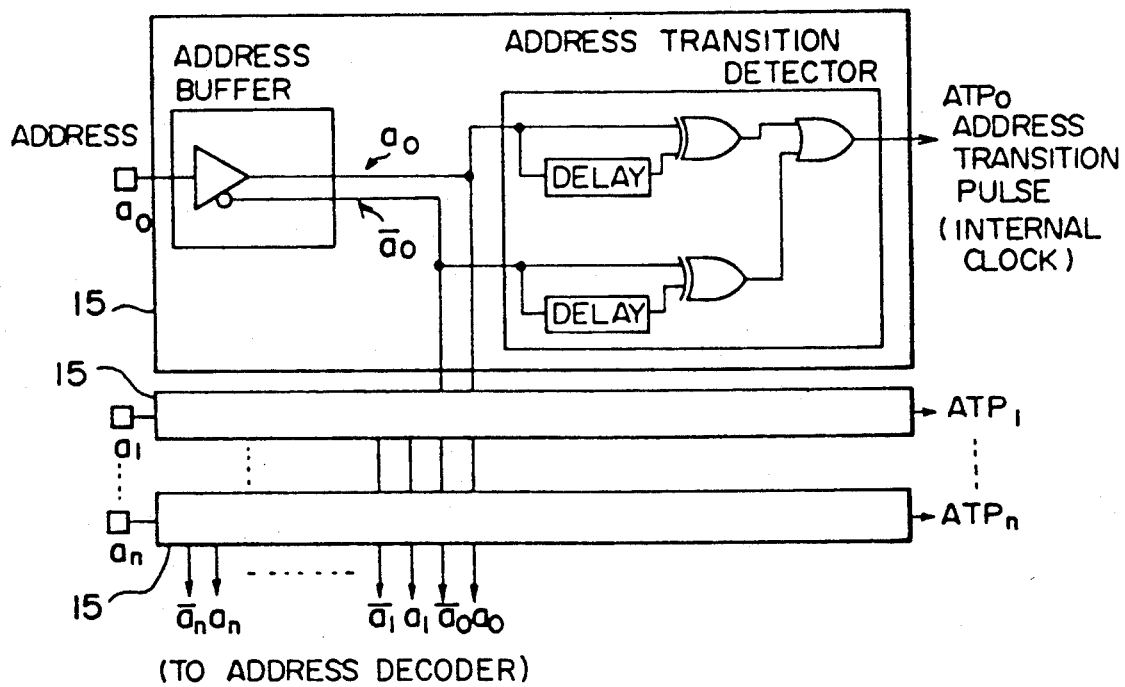
FIG. 1C is a circuit which generates signals to be applied to the circuit 10.
Figure 2A:
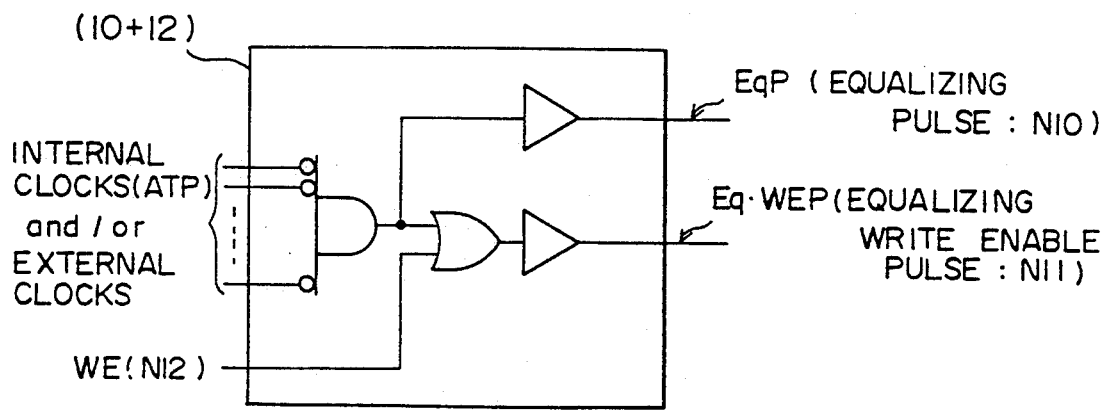
FIG. 2A shows details of circuits 10 and 12 shown in FIG. 2.

FIGS. 1A and 2A show the details of the circuits 9, 10 and 12, respectively. Signals applied to the circuit 10 and 12 are generated in the circuit shown in FIG. 1C.

The operation of the circuit constructed as above will be described below.

In reading data, the read/write selector 9 makes active the first sense amplifier 7 and second sense amplifier/output buffer 8, and makes inactive the data input/output circuit/write buffer 11. In this condition, a state of a memory cell 1 selected by a row decoder 2 and a column decoder 3 is transferred to the first sense amplifier 7. This state is further transferred to the input/output terminal 4 via the second sense amplifier/output buffer 8. In this case, the first and second MOS transistors Tr1 and Tr2 receive at their gates an equalizing pulse from the equalizing pulse generator 10, and turn on. The third and fourth MOS transistors Tr3 and Tr4 receive at their gates an equalizing pulse from the equalizing pulse/write pulse generator 12 when and address changes and turn on. Therefore, data present on data lines at the time of address change is invalidated.

On the other hand, in writing data, the read/write selector 9 makes inactive the first sense amplifier 7 and second sense amplifier/output buffer 8, and makes active the data input/output circuit/write buffer 11. In this condition, data applied to the input/output terminal 4 is written in a memory cell 1 selected by the row decoder 2 and column decoder 3. In this case, the gates of the third and fourth MOS transistors Tr3 and Tr4 are supplied with an on-signal from the equalizing pulse/write pulse generator 12. Therefore, data from the data input/output circuit/write buffer 11 is written in the memory cell 1 via the third and fourth MOS transistors Tr3 and Tr4. During this period, the gates of the first and second MOS transistors Tr1 and Tr2 are supplied with an off-signal from the equalizing pulse generator 10. If an address changes while writing data, an equalizing pulse is applied to the gates of the first and second MOS transistors Tr1 and Tr2 from the equalizing pulse generator 10. The data on the data lines is therefore invalidated at the time of address change.

The circuit for data reading is made of multiple stages by the first sense amplifier 7 and second sense amplifier/output buffer 8. On the contrary, the circuit for data writing is not made of multiple stages, but is made of a single stage of the data input/output circuit/write buffer 11. However, data write can be effected using common data lines.

Figure 2B:
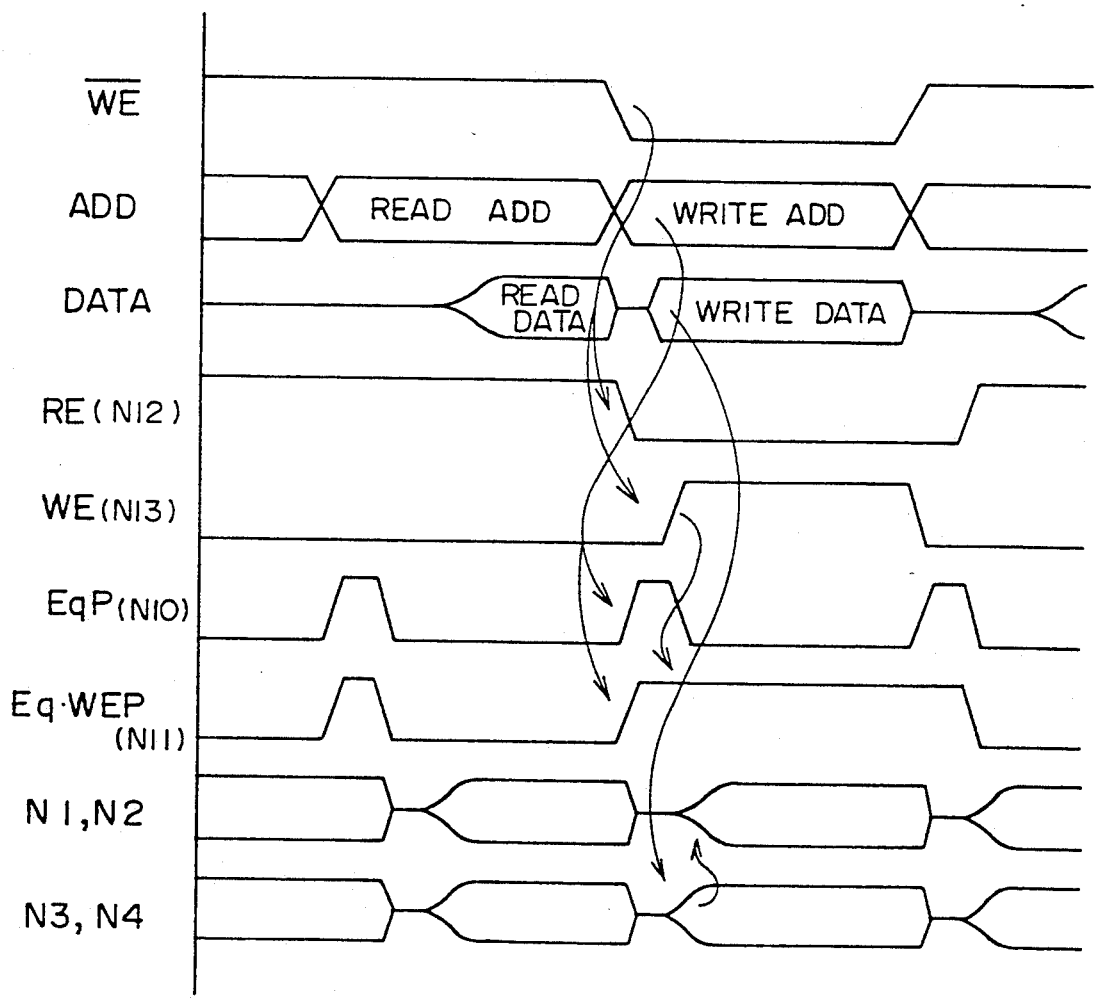
FIG. 2B is a timing chart which shows an operation of the circuit shown in FIG. 2.

The operation of the circuit shown in FIG. 2 is illustrated in a timing chart FIG. 2B.

FIG. 3 is a circuit diagram showing another embodiment of the present invention. In this embodiment, a plurality of stages of sense amplifiers are controlled by upper addresses of a memory, and have a hierarchical structure.

As shown in FIG. 3, provided for reading data from a memory cell 1 are a first sense amplifier group including a plurality of first sense amplifiers 71 and 72, and second and third sense amplifiers 13 and 14 respectively connected to the first sense amplifier 71. First to fourth MOS transistors Tr12 to Tr42 are connected to the first sense amplifier 72. First to fourth MOS transistors Tr13 to Tr43 are connected to the second sense amplifier 13. The first and second MOS transistors Tr11 and Tr21 are supplied with an equalizing pulse from an equalizing pulse generator 101. The third and fourth MOS transistors Tr31 and Tr41 are supplied with an equalizing pulse and a write signal from an equalizing pulse/write pulse generator 121. The first and second MOS transistors Tr12 and Tr22 are supplied with an equalizing pulse form an equalizing pulse generator 102. The third and fourth MOS transistors Tr32 and Tr42 are supplied with an equalizing pulse and write signal from an equalizing pulse/write pulse generator 122. The first and second MOS transistors Tr13 and Tr23 are supplied with an equalizing pulse from an equalizing pulse generator 103. The third and fourth MOS transistors Tr33 and Tr43 are supplied with an equalizing pulse and write pulse from an equalizing pulse/write pulse generator 123. As described previously, the second sense amplifier 13 is connected to the third sense amplifier/output buffer 14. Using this circuitry, data in a memory cell 1 is read and sent to an input/output terminal 4. Data applied to the input/output terminal 4 is written in a memory cell 1 selected by the row decoder 2 and column decoder 3, via the data input/output circuit/write buffer 11, MOS transistors Tr33, Tr32, Tr31, Tr43, Tr42, and Tr41.

With the circuit constructed as above, the operations by the equalizing pulse generators 101, 102, and 103 and the operations by the equalizing pulse/write pulse generators 121, 122, and 123, are similar to the circuit shown in FIG. 1. Specifically, in writing data, the equalizing pulse/write pulse generators 121, 122, and 123 supply signals to the third MOS transistors Tr33, Tr32, and Tr31 and to the fourth MOS transistors Tr43, Tr42, and Tr41, to turn them on. In this condition, data applied to the input/output terminal 4 is written in a memory cell via the data input/output circuit/write buffer 11, these MOS transistors, and common data lines. When an address changes, irrespective of during data reading or during data writing, the equalizing pulse generators 101, 102, and 103 and the equalizing pulse/write pulse generators 121, 122, and 123, supply equalizing pulses to all of the first MOS transistors Tr11, Tr12, and Tr13, of the second MOS transistors Tr21, Tr22, and Tr23, and of the third MOS transistors Tr31, Tr32, and Tr33. In this manner, data lines are invalidated at the time of address change.

What is claimed is:

1. A semiconductor memory device comprising:
   a memory cell array having at least one cell array unit, said cell array unit including a plurality of memory cells;
   selection means for selecting at least one of said memory cells in accordance with an externally supplied address;
   an input/output terminal for outputting data read form said selected memory cell and for receiving data supplied externally and sending said data to said selected memory cell;
   at least one data line for connecting said input/output terminal to each said cell array unit;
   sense amplifiers serially connected to each said data line in a multiple stage configuration for amplifying said read data;
   a write buffer connected in parallel with one of said sense amplifiers connected to each said data line;

by-pass switching means connected between input and output terminals of the other sense amplifiers connected to each said data line;

a control circuit for applying an on-signal to at least one said by-pass switching means when writing data, said ion-signal turning on said by-pass switching means; and a read/write selector, said control circuit receiving a write mode signal outputted from said read/write selector and outputting said on-signal.

2. A semiconductor memory device according to claim 1, wherein said control circuit receives a read mode signal outputted from said selector and outputs said on-signal, said by-pass switching means also functioning as input/output terminal equalizing means for data reading.

3. A semiconductor memory device according to claim 1, wherein each said sense amplifier further comprises input side complementary data lines equalizing switching means connected between said complementary data lines on the input side of said sense amplifier, and output side complementary data lines equalizing switching means connected between said complementary data lines on the output side of said sense amplifier, and wherein said control circuit receives said read mode signal outputted from said selector and outputs input side/output side on-signals for turning on said input side and output side complementary data lines equalizing switching means.

4. A semiconductor memory device according to claim 2, wherein each said sense amplifier further comprises input side complementary data lines equalizing switching means connected between said complementary data lines on the input side of said sense amplifier, and output side complementary data lines equalizing switching means connected between said complementary data lines on the output side of said sense amplifier, and wherein said control circuit receives said read mode signal outputted from said selector and outputs input side/output side on-signals for turning on said input side and output side complementary data lines equalizing switching means.

5. A semiconductor memory device comprising:
a memory cell array having at least one cell array unit, said cell array unit including a plurality of memory cells;
selection means for selecting at least one of said memory cells in accordance with an externally supplied address;
an input/output terminal for outputting data read from said selected memory cell and for receiving data supplied externally and sending said data to said selected memory cell;
at least one data line for connecting said input/output terminal to each said cell array unit;
sense amplifiers serially connected to each said data line in a multiple stage configuration for amplifying said read data;
a write buffer connected in parallel with one of said sense amplifiers connected to each said data line;
by-pass switching means connected between input and output terminals of the other sense amplifiers connected to each said data line;
a control circuit for applying an on-signal to at least one said by-pass switching means when writing data, said on-signal turning on said by-pass switching means; and a read/write selector, said control circuit receiving a write mode signal outputted from said read/write selector and outputting said on/signal, wherein said data line is a pair of complementary data lines for transferring complementary data to and from each said memory cell, and wherein said selection means includes a row decoder and a column decoder, respectively for receiving and decoding an address.

6. A semiconductor memory device according to claim 5, wherein said control circuit receives a read mode signal outputted from said selector and outputs said on-signal, said by-pass switching means also functioning as input/output terminal equalizing means for data reading.

7. A semiconductor memory device according to claim 5, wherein each said sense amplifier further comprises input side complementary data lines equalizing switching means connected between said complementary data lines on the input side of said sense amplifier, and output side complementary data lines equalizing switching means connected between said complementary data lines on the output side of said sense amplifier, and wherein said control circuit receives said read mode signal outputted from said selector and outputs input side/output side on-signals for turning on said input side and output side complementary data lines equalizing switching means.

8. A semiconductor memory device according to claim 6, wherein each said sense amplifier further comprises input side complementary data lines equalizing switching means connected between said complementary data lines on the input side of said sense amplifier, and output side complementary data lines equalizing switching means connected between said complementary data lines on the output side of said sense amplifier, and wherein said control circuit receives said read mode signal outputted form said selector and outputs input side/output side on-signals for turning on said input side and output side complementary data lines equalizing switching means.

9. A semiconductor memory device comprising:
a memory cell array having cell array units, said cell array units including a plurality of memory cells;
selection means for selecting at least one of said memory cells in accordance with an externally supplied address, said selection means includes a row decoder and a column decoder, respectively, for receiving an decoding an address;
an input/output terminal for outputting data read from said selected memory cell and for receiving data supplied externally and sending said data to said selected memory cell;
at least one data line for connecting said input/output terminal to each of said cell array units;
sense amplifiers serially connected to each said data line in a multiple stage configuration for amplifying said read data;
a write buffer connected in parallel with one of said sense amplifiers connected to each said data line;
by-pass switching means connected between input and output terminals of the other sense amplifiers connected to each said data line;

a control circuit for applying an on-signal to at least one said by-pass switching means when writing data, said on-signal turning on said by-pass switching means; and a read/write selector for outputting a write mode signal to said control circuit so that said control circuit outputs said on-signal.

10. A semiconductor memory device according to claim 9, wherein said control circuit receives a read mode signal outputted from said selector and outputs said on-signal, said by-pass switching means also functioning as input/output terminal equalizing means for data reading.

11. A semiconductor memory device according to claim 10, wherein said data line comprises a pair of complimentary data lines for transferring complementary data to and from each said memory cell.

12. A semiconductor memory device according to claim 1-0, wherein each said sense amplifier further comprises input side complementary data lines equalizing switching means connected between said complementary data lines on the input side of said sense amplifier, and output side complementary data lines equalizing switching means connected between said complementary data lines on the output side of said sense amplifier, and wherein said control circuit receives said read mode signal outputted from said selector and outputs input side/output side on-signals for turning on said input side and said output side complementary data lines equalizing switching means.

13. A semiconductor memory device according to claim 11, wherein each said sense amplifier further comprises input side complementary data lines equalizing switching means connected between said complementary data lines on the input side of said sense amplifier, and output side complementary data lines equalizing switching means connected between said complementary data lines on the output side of said sense amplifier, and wherein said control circuit receives said read mode signal outputted from said selector and outputs input side/output side on-signals for turning on said input side and output side complementary data lines equalizing switching means.

* * * * *